(12) United States Patent
Schiaffino et al.

(10) Patent No.: US 7,348,212 B2
(45) Date of Patent: Mar. 25, 2008

(54) INTERCONNECTS FOR SEMICONDUCTOR LIGHT EMITTING DEVICES

(75) Inventors: Stefano Schiaffino, Pleasanton, CA (US); Ashim Shatil Haque, San Jose, CA (US); Paul S. Martin, Pleasanton, CA (US); Daniel A. Steigerwald, Cupertino, CA (US); Decai Sun, Los Altos, CA (US)

(73) Assignee: Philips Lumileds Lighting Company LLC, San Jose, CA (US)

( * ) Notice: Subject to any disclaimer, the term of this patent is extended or adjusted under 35 U.S.C. 154(b) by 162 days.

(21) Appl. No.: 11/226,151

(22) Filed: Sep. 13, 2005

(65) Prior Publication Data

US 2007/0057271 A1   Mar. 15, 2007

(51) Int. Cl.
*H01L 21/00* (2006.01)

(52) U.S. Cl. .............................. 438/106; 257/E21.499
(58) Field of Classification Search ................ 438/106; 257/E21.499
See application file for complete search history.

(56) References Cited

U.S. PATENT DOCUMENTS

| | | | |
|---|---|---|---|
| 5,777,433 A | 7/1998 | Lester et al. | |
| 6,274,924 B1 | 8/2001 | Carey et al. | |
| 6,486,499 B1 | 11/2002 | Krames et al. | |
| 2005/0045901 A1 | 3/2005 | Wall, Jr. | |
| 2005/0072835 A1* | 4/2005 | Choi et al. | 228/180.22 |
| 2005/0184387 A1 | 8/2005 | Collins, III et al. | |
| 2006/0138444 A1* | 6/2006 | Chio et al. | 257/100 |

* cited by examiner

*Primary Examiner*—Scott B. Geyer
*Assistant Examiner*—Elias Ullah
(74) *Attorney, Agent, or Firm*—Patent Law Group LLP; Rachel V. Leiterman

(57) ABSTRACT

A semiconductor light emitting device including a light emitting layer disposed between an n-type region and a p-type region and contacts electrically connected to the n-type region and the p-type region is connected to a mount. A metal layer arbitrarily patterned to cover at least 20% of the area of the semiconductor light emitting device is plated on either a metal layer formed on the mount or a metal layer formed on one of the contacts. The plated metal layer may replace other known interconnecting techniques such as stud bumps. The semiconductor light emitting device is physically connected to the mount by causing interdiffusion between the contact surfaces of the metal layers. In some embodiments, a layer of solder is formed over the plated metal layer, and then the semiconductor light emitting device is physically connected to the mount by heating the solder.

20 Claims, 5 Drawing Sheets

INTERCONNECTS FOR SEMICONDUCTOR LIGHT EMITTING DEVICES

BACKGROUND

1. Field of Invention

This invention relates to methods of attaching semiconductor light emitting devices to other structures.

2. Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors; for example, binary, ternary, and quaternary alloys of gallium, aluminum, indium, nitrogen, phosphorus, and arsenic. III-V devices emit light across the visible spectrum. GaAs- and GaP-based devices are often used to emit light at longer wavelengths such as yellow through red while III-nitrite devices are often used to emit light at shorter wavelengths such as near-UV through green.

FIG. 1 illustrates a prior art package for a GaAs- or GaP-based device, described in more detail in U.S. Pat. No. 5,777,433. LED 10 includes a semiconductor LED chip 12 encapsulated by a package 11, typically a thermoset material such as epoxy or thermo-plastic material. A p-n junction 13 within LED chip 12 generates light. A pair of electrical contacts 15 and 16 connect to the LED chip 12, contact 16 by a wire bond 14, and contact 15 by, for example, epoxy. The epoxy connecting LED chip 12 to contact 15 makes device 10 suitable for only low temperature applications, since epoxy typically cannot tolerate high temperatures without degrading. In addition, epoxy has very high thermal resistance, thus the design of FIG. 1 provides only high resistance pathways for heat to escape LED chip 12, limiting device 10 to low power applications.

As semiconductor light emitting devices capable of operating at high power were developed, new packages which could tolerate higher heat and which could more efficiently remove heat from the semiconductor device are required. FIGS. 2 and 3 illustrate a cross sectional view and a plan view of a flip chip III-nitrite device, described in more detail in U.S. Pat. No. 6,486,499, which is incorporated herein by reference. The device of FIGS. 2 and 3 is a large-area, e.g.>400×400 µm$^2$ LED with reduced thermal resistance from the p-n junction to the lamp package. The device of FIGS. 2 and 3 uses an inverted structure employing a low resistivity, opaque, highly reflective p-electrode.

In the cross-sectional view shown in FIG. 2, the device includes a III-nitrite epitaxial heterostructure of n-type and undoped layers 111 and p-type layers 12, each in contact with an active region 13. The III-nitrite layers 11 are optionally attached to a transparent substrate 10. The substrate 10 can be the growth substrate for deposition of the III-nitrite layers. In the plan view of the bottom of the LED die shown in FIG. 3, n-electrode 22 includes "fingers" interposing the p-electrode metallization 20 to spread current throughout the device. Light may be taken out of the device through the transparent substrate 10 due to a highly reflective, thick p-electrode metallization 20. The electrode metallizations connect to submount electrodes 52 on a submount substrate 50 via interconnects 60. The interconnects make electrical connection between the LED and the submount while providing a thermal path for heat removal from the LED during operation. The interconnects may be made of elemental metals, metal alloys, semiconductor-metal alloys, solders, thermally and electrically conductive pastes or compounds (e.g., epoxies), eutectic joints (e.g., Pd—In—Pd) between dissimilar metals between the LED die and submount, Au stud-bumps, or solder bumps.

The interconnects are attached to the LED and submount via conductive interfaces 41, 54. When solder is used as the interconnect, the conductive interfaces are wettable metals. An application process initially determines the interconnect thickness and area. One applicable technique is a screen-printing process where paste is applied to selected areas on the submount wafer or LED. Other techniques include electroplating, lift-off, and reflow. For an embodiment using solder as the interconnect, the final interconnect thickness and area are determined by the solder volume as well as the wettable metals 41 on the LED die and 54 on the submount. The solderable areas on the LED are defined through patterning of the wetting metals, or through vias in a patterned dielectric passivation layer 42 provided on the LED die. The dielectric passivation layer 42 acts as an electrical isolation layer between the p and n electrodes and is required since the solder layers 60 extend across both p and n electrodes. The solderable areas on the submount are similarly defined by patterning the solderable metals 54 or by providing a dielectric layer 51. A second set of solderable metal layers 55 may be deposited on the back of the submount for attachment to the remaining part of the package. Optionally, a suitable solder can be deposited directly on the back of the submount. The junction-to-package thermal resistance is largely governed by the die/submount solder joint and the submount material and geometry. Hence, it is desirable to cover the entire surface of the LED die with the solder. This is not possible as electrical isolation is required between the p and n electrode regions of the LED. Also, the width of this gap between the n and p solderable metals must account for tolerances in die attaching to the submount. Even so, the device of FIG. 3 provides about 85% solder coverage (defined as the ratio of solderable metal area 41 relative to the p electrode area 20).

Like the device illustrated in FIG. 1, the device illustrated in FIGS. 2 and 3 also has limited temperature operation, as it is limited to operating conditions below the melting point of solder layers 60. For example, typical solders such as eutectic SnPb and eutectic AuSn are limited to operating temperatures of 183° C. and 280° C., respectively. Also, attaching the semiconductor device to the submount as illustrated in FIG. 2 generally involves reflowing solder layers 60, typically by rapidly heating the semiconductor device and the submount to a temperature above the melting point of the solder. This process may damage the semiconductor device by introducing thermal stress. Further, solders are often alloys and often include Sn. Alloys typically have worse thermal conductivity than pure metals, and at elevated temperatures, Sn can damage the metal electrodes attached to the semiconductor layers.

Needed in the art are package connection designs and attach techniques which provide low thermal resistance, facilitate high temperature operation, do not require stressful processing conditions such as high process temperatures, and are inexpensive and easy to manufacture.

SUMMARY

Embodiments of the present invention teach methods of mounting a semiconductor light emitting device including a light emitting layer disposed between an n-type region and a p-type region and contacts electrically connected to the n-type region and the p-type region. A metal layer is plated on either a metal layer formed on the mount or a metal layer formed on one of the device contacts. The semiconductor light emitting device is then physically connected to the mount by causing interdiffusion between the contact surfaces of the metal layers, for example by causing the device to vibrate, by applying heat to the device, and/or by applying pressure to the device. In some embodiments, a layer of solder is formed over the plated metal layer, then the semiconductor light emitting device is physically connected to the mount by heating the solder.

Interconnects according to embodiments of the invention may withstand high operating temperatures with reduced degradation or failure, may advantageously lower the thermal and electrical resistance of the connection between the device and the mount by covering large thin areas and by using high thermal conductivity metals, may permit inexpensive high volume manufacture, and may improve the reliability of devices and reduce the frequency of device failure caused by cracking in the semiconductor layers as a result of stress.

DETAILED DESCRIPTION

Figure 4:
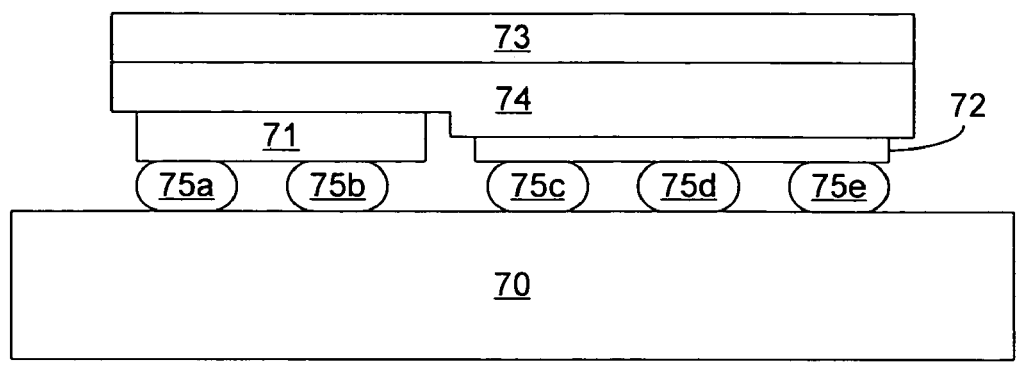
FIG. 4 illustrates a flip chip light emitting device attached to a mount by metal-to-metal interconnects.

FIG. 4 illustrates a flip chip light emitting device attached to a mount The flip chip device includes a substrate 73 attached to semiconductor device layers 74, which include at least one light emitting or active layer disposed between an n-type region and a p-type region. N-type contact 71 and p-type contact 72 are electrically connected to the n- and p-type regions of semiconductor structure 74. Semiconductor structure 74 is connected to mount 70 via contacts 71 and 72 by several metal-to-metal interconnects 75a-75e. Mount 70 may be any suitable material including, for example, metals such as copper, semiconductors such as Si, ceramics such as alumina or AlN, or composite mounts such as printed circuit boards and metal core printed circuit boards.

Metal interconnects 75a-75e are often Al, Au, Cu, or Ni. The interconnects are formed in a stud bumping process where thin metal layers (not shown) are formed on both mount 70 and contacts 71 and 72 at the site of each interconnect. An interconnecting metal ball is formed on each thin metal layer on either mount 70 or contacts 71 and 72 by feeding a metal wire through a capillary and exposing the wire to an electrostatic discharge that melts a portion of the wire into a metal ball. The semiconductor device is then positioned on mount 70, and thermosonic energy is applied to the device and the mount to achieve metal-to-metal interdiffusion at an atomic level between the thin metal layers and the interconnecting metal ball, such that often there is no discernable interface between the two thin metal layers and the interconnecting metal ball. Such metal-to-metal interconnects result in a metallurgically uniform joint, permit high operating temperatures in the finished device, and can be formed at relatively low processing temperatures.

Figure 9:
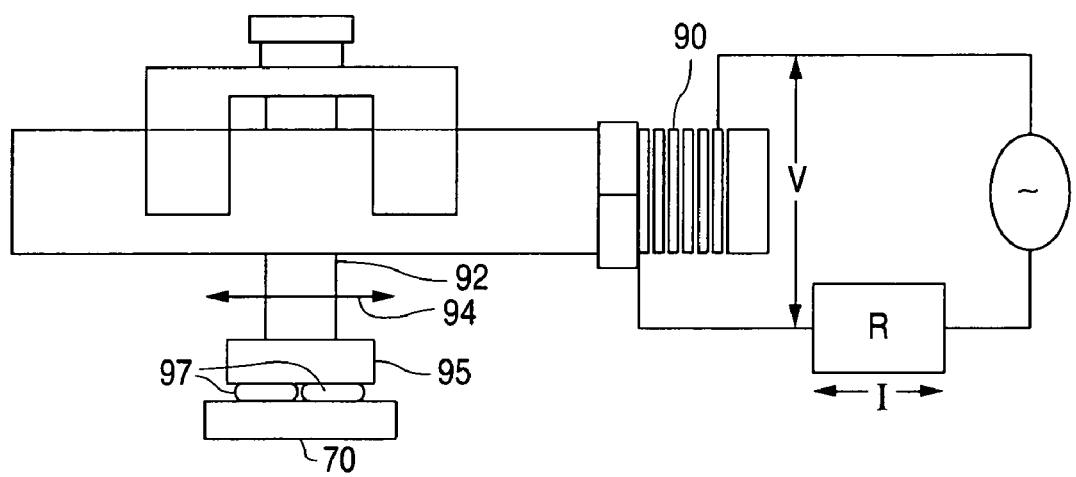
FIG. 9 illustrates a thermosonic bonding apparatus.

Thermosonic bonding is illustrated in FIG. 9. Semiconductor device 95 is positioned on a mount 70. One or more metal interconnects 97 are formed on one or both of device 95 and mount 70. A bond head 92 is positioned on the top surface of semiconductor device 95, often the top surface of a sapphire growth substrate in the case of a III-nitride device grown on sapphire. Bond head 92 is connected to an ultrasonic transducer 90. Ultrasonic transducer 90 may be, for example, a stack of lead zirconate titanate (PZT) layers. When a voltage V is applied to transducer 90 at a frequency that causes the system to resonate harmonically (often a frequency on the order of tens or hundreds of kHz), transducer 90 begins to vibrate, which in turn causes bond head 92 and device 95 to vibrate, often at an amplitude 94 on the order of microns. The vibration causes atoms in the metal lattice of interconnects 97 to interdiffuse, resulting in a metallurgically uniform joint.

In some embodiments, the process illustrated in FIG. 9 may occur at a temperature between 150 and 200° C., a temperature lower and therefore less damaging than the processing temperature required in some prior art techniques. In some embodiments, pressure is applied to the top of bond head 92, for example on the order of 100 N/mm$^2$ of interconnect area.

One drawback to the metal-to-metal interconnects illustrated in FIG. 4 is that the stud bumping process described above forms interconnects 75a-75e one at a time in a serial approach. Such a serial approach is time-consuming and thus expensive for high volume manufacturing. Also, the footprint of the individual interconnects is limited to roughly round bumps that must be spaced to avoid overlap and interference between individual interconnects. Overlapping or interfering interconnects may result in a mechanically weak connection with poor thermal properties. The use of round, spaced-apart bumps limits the contact area, undesirably increasing the thermal resistance of the connection between the semiconductor device and the mount.

Figure 5:
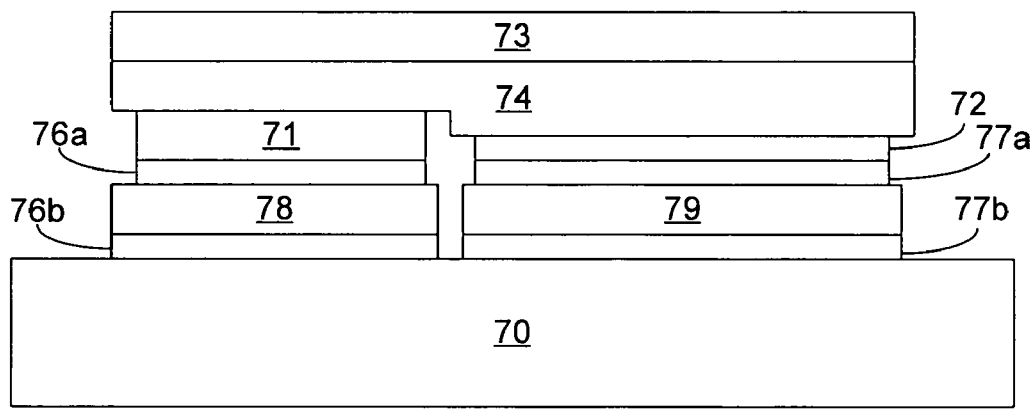
FIG. 5 illustrates a device according to an embodiment of the invention.

In accordance with embodiments of the invention, devices including large area metal-to-metal interconnects are provided. FIG. 5 illustrates a first embodiment of the invention. A metal-to-metal interconnect more extensive than the round bumps shown in FIG. 4 is formed by first forming thin layers of metal on mount 70 and contacts 71 and 72, then lithographically patterning the thin metal layers into the desired arrangement, resulting in thin metal regions in the desired shape. In FIG. 5, these thin metal regions are regions 76a and 77a on contacts 71 and 72, and 76b and 77b on mount 70. Contacts 71 and 72 may include several metal layers serving different purposes, for example contacts 71 and 72 may include one or more ohmic layers, reflective layers, guard metal layers, and bonding layers. Thin metal regions 76a and 77a may be part of a multilayer contact structure, or may be added in addition to the other metal layers forming contacts 71 and 72. In other words, thin metal regions 76a and 77a may serve a purpose in addition to facilitating forming interconnects, such as guarding another metal layer in the contact or providing a reflector, or thin metal regions 76a and 77a may be applied solely to form interconnects. Similarly, on mount 70, thin metal regions 76b and 77b may be part of a multilayer contact structure or formed in addition to a contact structure.

Figure 1:
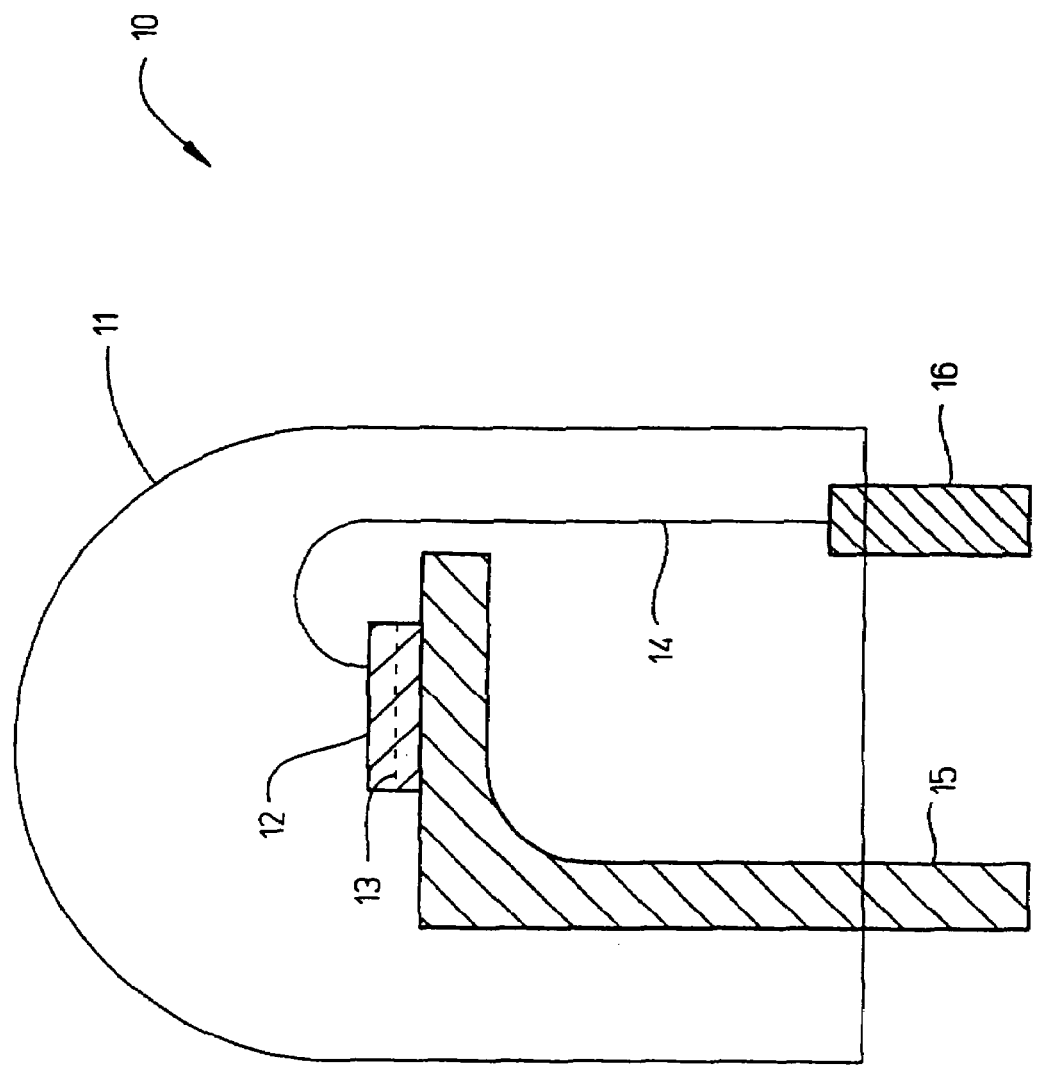
FIG. 1 illustrates a prior art packaged light emitting device.
Figure 2:
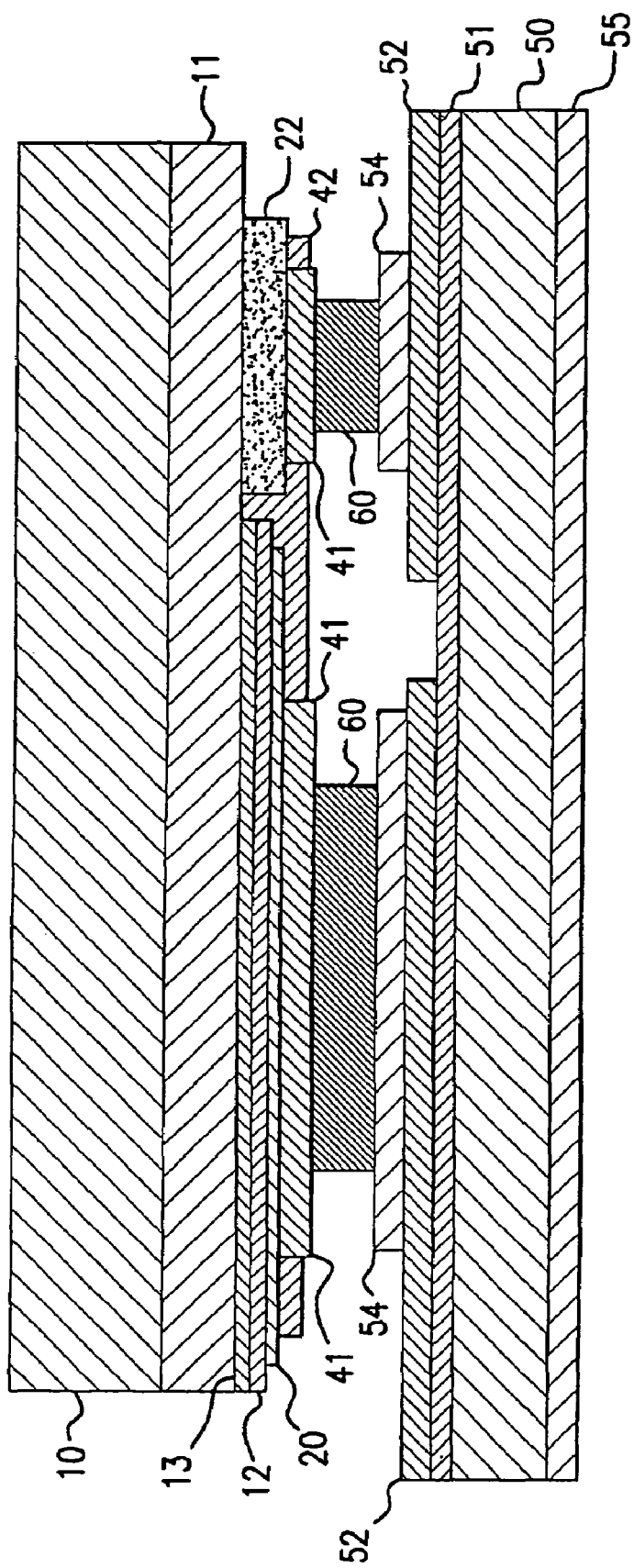
FIG. 2 is a cross sectional view of a prior art flip chip light emitting device mounted on a mount.
Figure 3:
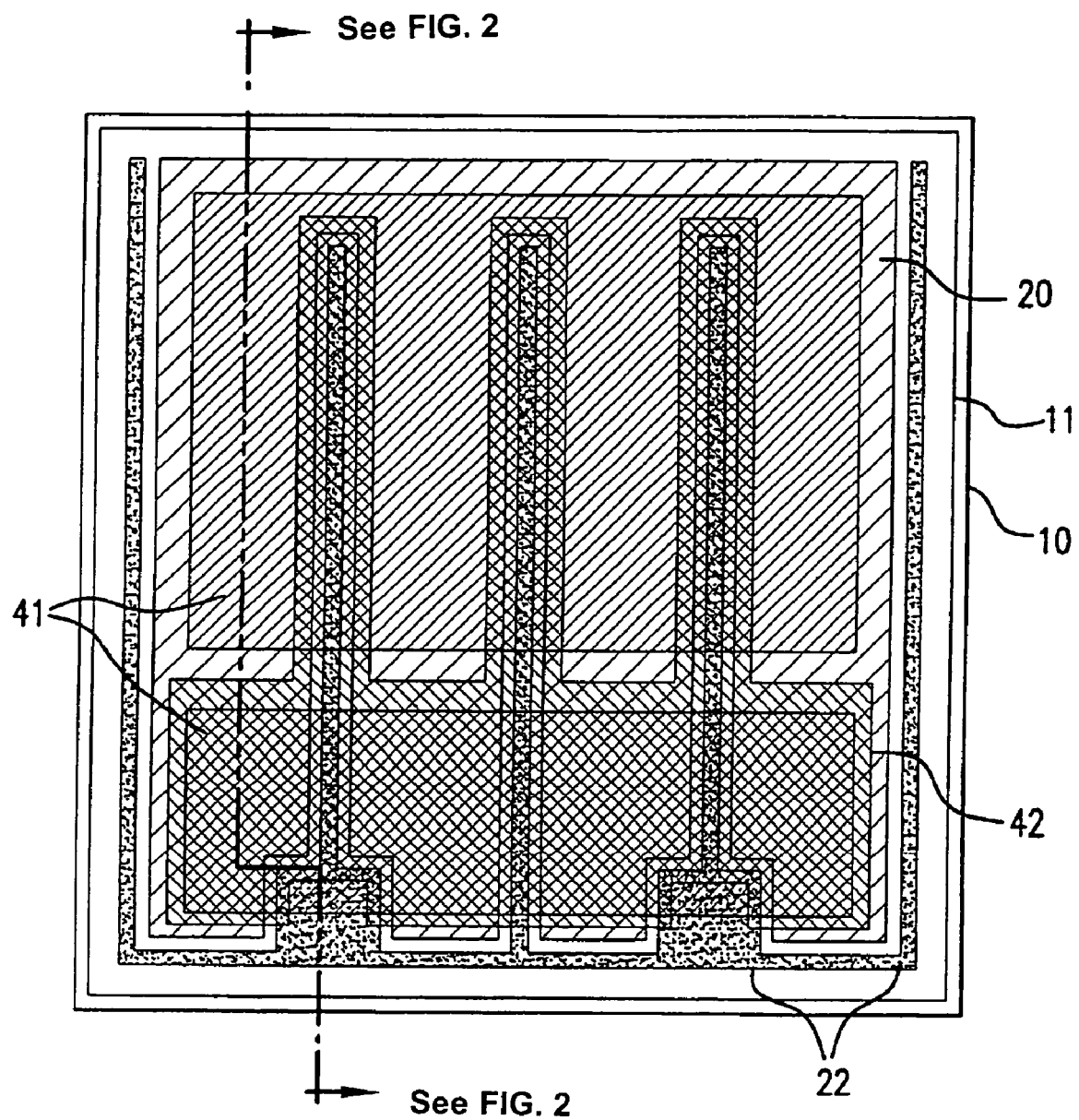
FIG. 3. is a plan view of a prior art light emitting device.
Figure 7:
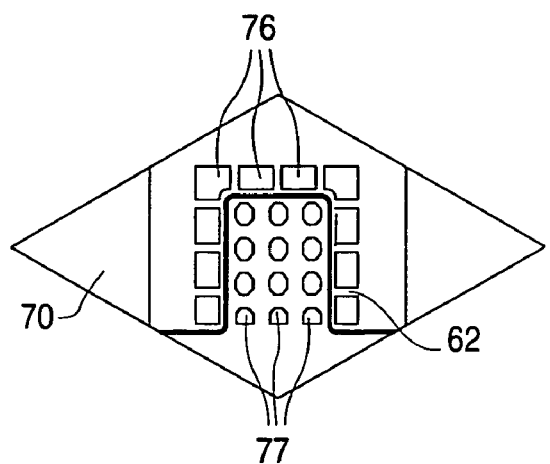
FIGS. 7 and 8 illustrate interconnect designs for a device such as that illustrated in FIG. 3, according to embodiments of the invention.
Figure 8:
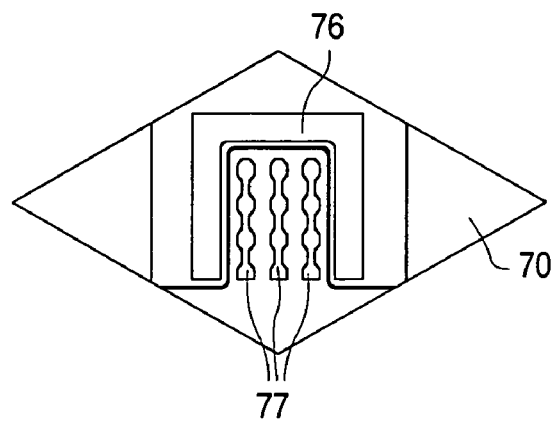

Patterning thin metal regions 76a, 76b, 77a, and 77b by conventional lithography techniques permits great flexibility in the shape and placement of the interconnects, as well as a higher degree of accuracy and resolution than can be achieved with the round bumps illustrated in FIG. 4. The shape and placement of the interconnects depends on the arrangement of the n-type and p-type contacts on the semiconductor device. Generally, it is desirable to maximize the lateral extent of the connection between mount 70 and n-type and p-type contacts 71 and 72, in order to reduce the thermal and electrical resistance of the interface between the semiconductor device and the mount. The ratio of the area of the interconnects to the area of semiconductor structure 74 is preferably at least 20%, more preferably at least 30%, more preferably at least 40%, more preferably at least 60%, and more preferably at least 80%. FIGS. 7 and 8 illustrate arrangements of metal layers 76b and 77b on mount 70 which are compatible with the III-nitrite flip chip light emitting device illustrated in FIG. 3. In the mount shown in FIG. 7, the ratio of the area of the interconnects to the area of the device contacts is about 40%; in the mount shown in FIG. 8, the ratio is about 60%. Using multiple interconnects separated by regions 62 without the interconnect as illustrated in FIG. 7, instead of a single, continuous interconnect as illustrated in FIG. 8, may be advantageous because less interconnect material is required, reducing the cost. In addition, the thermosonic process illustrated in FIG. 9 may result in a stronger bond when the interconnect material has space to spread laterally during the thermosonic bonding process. Also, the more rigid bond caused by a single, continuous interconnect may result in more stress applied to the semiconductor light emitting device than in a device with multiple interconnects.

After patterning thin metal regions 76a, 77a, 76b, and 77b, thick ductile metal layers 78 and 79 are plated on either mount 70 or contacts 71 and 72, thus on either regions 76a and 77a or regions 76b and 77b. Metal layers 78 and 79 are selected to be ductile, have high thermal and electrical conductivity, and be reasonably resistant to oxidation. For example, metal layers 78 and 79 may be Au, which has good thermal conductivity and is inexpensive; Cu, which has even better thermal conductivity than Au; Ni; or Al, which is less expensive than Au or Cu. Depending on the metal used, barrier layers may be included between metal layers 78 and 79 and semiconductor structure 74 to protect the semiconductor layers from contamination by metal layers 78 and 79, or between metal layers 78 and 79 and mount 70 to protect the mount from contamination by metal layers 78 and 79. In some embodiments, thick metal layers 78 and 79 are the same metal as the thin metal layers on which they are plated. In other embodiments, thick metal layers 78 and 79 are a different metal. For example, some or all of thin metal regions 76a, 77a, 76b, and 77b may be Au, and thick metal layers 78 and 79 may be Al.

Metal layers 78 and 79 are plated on either mount 70 or contacts 71 and 72 as follows. First, a thin seed metal layer, such as 100-500 nm of Ti or TiW, is deposited over the entire surface of the wafer to be plated, for example by sputtering. The seed layer creates a continuous conductive layer on the surface, necessary for plating. Photoresist is then applied and patterned, such that plating occurs only on the intended surfaces. For example, photoresist is removed from the surfaces of metal regions 76b and 77b, and remains in the area between these metal regions to prevent plating in the area between the metal regions. The wafer is then dipped in an appropriate electroplating bath and thick metal layers 78 and 79 are plated on the wafer. The wafer is removed from the bath, the remaining photoresist is stripped, and the wafer is dipped in a solution to strip off the seed layer beneath the regions from which the remaining photoresist was stripped. In some embodiments, thick metal layers 78 and 79 may be formed by a process other than plating, such as evaporation.

Metal layers 78 and 79 may be between one and 50 microns thick and are often between 5 and 20 microns thick. The thickness of the interconnects is controlled by controlling the plating conditions. In general, metal layers 78 and 79 are plated as quickly as possible, to reduce processing time and cost. However, typically when a metal layer such as gold is plated quickly, the resulting layer is very hard, which may be difficult to bond in the thermosonic process illustrated in FIG. 9. Accordingly, in some embodiments after plating, metal layers 78 and 79 are annealed to soften them, for example at a temperature less than 350° C. for about 1 hour. In such embodiments, metal layers 78 and 79 may be formed on mount 70, which is better able to tolerate the anneal conditions than semiconductor structure 74. Thinner layers 78 and 79 are desirable as they are generally less expensive and easier to form, though thicker layers may provide a more reliable connection. Metal layers 78 and 79 may provide a more compliant interconnect than the interconnects in the devices of FIGS. 1-4, which may reduce the amount of stress in the semiconductor structure caused by, for example, heating and cooling cycles. Such stress can cause cracking which may impair performance or lead to failure of the device. The thicker layers 78 and 79 are formed, the more such stress relief is provided.

After forming thin patterned metal layers 76a, 77a, 76b, and 77b and thick ductile layers 78 and 79, the semiconductor device is positioned on mount 70 and the device and the mount are joined by any process that results in interdiffusion between thin metal layers 76a, 77a, 76b, and 77b and thick metal layers 78 and 79. Examples of suitable processes include the thermosonic process described above in reference to FIG. 9 and thermal compression bonding, where the device and mount are heated, for example to a temperature between 150 and 600° C., often 300 to 600° C., and pressed together, for example at a pressure between 10 and 200 N/mm$^2$ of interconnect area.

Figure 6:
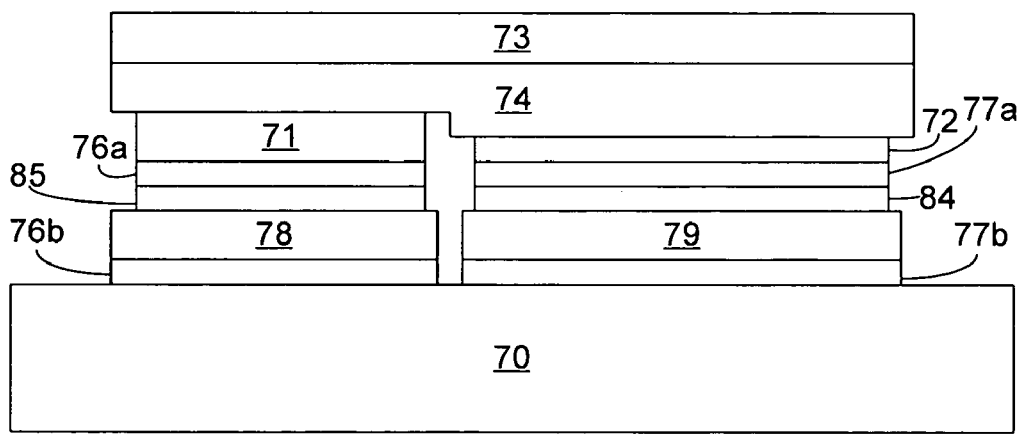
FIG. 6 illustrates a device according to an alternate embodiment of the invention.

FIG. 6 illustrates an alternate embodiment of the invention. In the device of FIG. 6, thin layers of solder 84 and 85 are formed over thick ductile metal layers 78 and 79. Solder layers 84 and 85 may be, for example, eutectic AuSn solder formed between 3 and 5 microns thick. Alternatively, solder layers 84 and 85 may be a thin cap of Sn formed over Au layers 78 and 79. Solder layers 84 and 85 may be formed, for example, by plating or by evaporation. The semiconductor device is then positioned on submount 70 and joined to submount 70 by reflow of solder layers 84 and 85, for example at a temperature greater than 280° C.

The interconnects described in the above embodiments may offer several advantages. First, the interconnects can withstand high operating temperatures without degrading or disintegrating, and in some embodiments without the presence of Sn which may contaminate the device contacts at high operating temperature. Second, the methods described above permit forming interconnects that cover a larger area of the device layer contacts than the stud bumping process described above. The use of larger area interconnects may advantageously lower the thermal and electrical resistance of the interconnects. Third, the deposit and lithographic patterning of thin metal layers and the plating of thick metal layers are batch processes, which are less time consuming and thus less expensive than the serial process required to form the stud bumps illustrated in FIG. 4. Fourth, compliant thick ductile layers may reduce stresses in the semiconductor device, potentially improving the reliability of devices and reducing the frequency of device failure caused by cracking in the semiconductor layers as a result of stress. Fifth, the interconnects can be formed from pure metals such as Au and Cu, not alloys such as solder. Pure metals typically have better thermal conductivity than alloys. Sixth, the interconnects described above may be thinner than solder layers used in prior art interconnects. The use of thinner interconnects may advantageously lower the thermal and electrical resistance of the interconnects.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A method comprising:
    providing a semiconductor light emitting device comprising:
        a light emitting layer disposed between an n-type region and a p-type region;
        contacts electrically connected to the n-type region and the p-type region; and
        a first metal layer formed on one of the contacts;
    providing a mount comprising:
        a second metal layer formed on the mount; and
        a third metal layer plated over the second metal layer; and
    physically connecting the semiconductor light emitting device to the mount by causing interdiffusion of the first, second, and third metal layers;
    wherein the third metal layer has a lateral extent of at least 20% of an area of the semiconductor light emitting device.

2. The method of claim 1 wherein causing interdiffusion comprises causing the semiconductor light emitting device to vibrate.

3. The method of claim 1 wherein the first and second metals each comprise one of Au, Cu, Ni, and Al.

4. The method of claim 1 wherein the third metal comprises one of Au, Cu, Ni, and Al.

5. The method of claim 1 further comprising lithographically patterning the first and second metal layers to form predetermined shapes.

6. The method of claim 1 further comprising annealing the third metal layer after plating.

7. The method of claim 1 wherein causing interdiffusion comprises providing an ambient temperature between 150 and 600° C.

8. The method of claim 1 causing interdiffusion comprises applying pressure to the semiconductor light emitting device.

9. The method of claim 1 wherein a thickness of the third metal layer is between 1 and 50 microns.

10. The method of claim 1 wherein a thickness of the third metal layer is between 5 and 20 microns.

11. The method of claim 1 wherein the third metal layer has a lateral extent of at least 30% of an area of the semiconductor light emitting device.

12. The method of claim 1 wherein the third metal layer has a lateral extent of at least 40% of an area of the semiconductor light emitting device.

13. A method comprising:
    providing a semiconductor light emitting device comprising:
        a light emitting layer disposed between an n-type region and a p-type region; and
        contacts electrically connected to the n-type region and the p-type region;
    forming a first metal layer on one of the contacts;
    plating a second metal layer on the first metal layer;
    providing a mount comprising a third metal layer formed on the mount; and
    physically connecting the semiconductor light emitting device to the mount by causing interdiffusion of the first, second, and third metal layers;
    wherein the second metal layer has a lateral extent of at least 20% of an area of the semiconductor light emitting device.

14. The method of claim 13 wherein the first and third metals each comprise one of Au, Cu, Ni, and Al.

15. The method of claim 13 wherein the second metal comprises one of Au, Cu, Ni, and Al.

16. The method of claim 13 wherein causing interdiffusion comprises causing the semiconductor light emitting device to vibrate.

17. The method of claim 13 wherein causing interdiffusion comprises providing an ambient temperature between 150 and 600° C.

18. The method of claim 13 causing interdiffusion comprises applying pressure to the semiconductor light emitting device.

19. The method of claim 13 wherein a thickness of the second metal layer between 1 and 50 microns.

20. method of claim 13 wherein a thickness of the second metal layer is between 5 and 20 microns.

* * * * *

UNITED STATES PATENT AND TRADEMARK OFFICE
CERTIFICATE OF CORRECTION

PATENT NO. : 7,348,212 B2
APPLICATION NO. : 11/226151
DATED : March 25, 2008
INVENTOR(S) : Stefano Schiaffino et al.

It is certified that error appears in the above-identified patent and that said Letters Patent is hereby corrected as shown below:

Column 8, line 49, claim 19: Cancel "layer between" and substitute --layer is between--.

Column 8, line 51, claim 20: Cancel "method" and substitute --The method--.

Signed and Sealed this

Sixteenth Day of September, 2008

JON W. DUDAS
*Director of the United States Patent and Trademark Office*